US006608511B1

(12) United States Patent
Hsu

(10) Patent No.: US 6,608,511 B1
(45) Date of Patent: Aug. 19, 2003

(54) CHARGE-PUMP PHASE-LOCKED LOOP CIRCUIT WITH CHARGE CALIBRATION

(75) Inventor: Wei-Chan Hsu, Mountain View, CA (US)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 10/196,182

(22) Filed: Jul. 17, 2002

(51) Int. Cl.[7] .................................................. H03L 7/00

(52) U.S. Cl. ....................... 327/157; 327/536; 331/1 A; 363/59; 363/60

(58) Field of Search ................................. 327/156, 157, 327/536, 537, 590; 307/110; 363/59, 60; 331/1 A, 17, 25

(56) References Cited

U.S. PATENT DOCUMENTS 6,043,715 A * 3/2000 Bailey et al. .................. 331/2
6,222,421 B1 * 4/2001 Kiyose ........................ 331/17
6,489,851 B1 * 12/2002 Miyada et al. ................ 331/11

* cited by examiner

*Primary Examiner*—Timothy P. Callahan
*Assistant Examiner*—An T. Luu
(74) *Attorney, Agent, or Firm*—Rabin & Berdo, P.C.

(57) ABSTRACT

A charge-pump phase-locked loop (PLL) circuit with charge calibration. The PLL keeps the phase of an output clock signal constant in a "locked" condition, and includes a first charge pump, a second charge pump and a charge sensing circuit. The first and the second charge pumps provide a first current and a second current, respectively. According to a first and second net charge delivered from the first and the second currents separately, the charge sensing circuit provides a calibrate voltage signal as feedback to the first charge pump and the second charge pump. Under control of the calibrate voltage signal, the first and the second charge pumps regulate the first net charge and the second net charge to become exactly zero thereby maintaining the phase of the output clock signal locked onto the phase of a reference clock signal.

20 Claims, 2 Drawing Sheets

CHARGE-PUMP PHASE-LOCKED LOOP CIRCUIT WITH CHARGE CALIBRATION

BACKGROUND OF THE INVENTION

1. Field of the Invention

The invention relates to a phase-locked loop (hereinafter referred to as PLL) circuit. More particularly, the invention relates to a charge-pump PLL circuit with charge calibration.

2. Description of the Related Art

Many electronic and computer systems and components have critical timing requirements that compel generation of periodic clock waveforms that are precisely synchronized with a reference clock waveform. A phase-locked loop (PLL) is one type of circuit that is widely used to provide an output signal having a precisely controlled frequency that is synchronized with the frequency of a received or input signal. Frequency synthesizers, multipliers and dividers, single and multiple clock generators, clock recovery circuits, and wireless communication devices are (but a few) examples of the manifold implementations of PLLs.

FIG. 1 illustrates a block diagram of a typical charge-pump PLL 100. The charge-pump PLL circuit 100 includes a phase detector 110, a charge pump circuit 120, a loop filter 130, a voltage-controlled oscillator (VCO) 140 and a frequency divider 150. The PLL 100 receives a reference clock signal $CLK_{ref}$ having a frequency $F_{ref}$ and generates an output clock signal $CLK_{out}$ having a frequency $F_{out}$ that is synchronized with the reference clock signal $CLK_{ref}$ in phase. The reference clock signal $CLK_{ref}$ is coupled into the phase detector 110, where it is compared with a feedback signal $CLK'_{out}$. Based on this comparison, the phase detector 110 generates a pump-up signal UP and a pump-down signal DN which, in turn, direct the charge pump circuit 120 to either source or sink current to or from the loop filter 130 which develops a voltage $V_c$ for adjusting the output frequency of the VCO 140. The output of the VCO 140, which is the output of the PLL 100, is coupled to the frequency divider 150. The feedback signal $CLK'_{out}$ may be the same as the output clock signal $CLK_{out}$ from the VCO 140, or as illustrated in FIG. 1 the feedback signal $CLK'_{out}$ may be the output of the frequency divider 150. Although the frequency divider 150 is commonly used in the PLL 100 to divide the frequency received from the VCO 140 by N, it may be eliminated in certain applications.

The charge pump 120 generates a current $I_{CP}$ that develops the voltage $V_c$ across the loop filter 130. The current $I_{CP}$ is dependent on the UP and DN signals from the phase detector 110. When the rising edge of $CLK_{ref}$ leads the rising edge of $CLK'_{out}$, the charge pump circuit 120 increases $I_{CP}$ to develop a larger $V_c$ across the loop filter 130 which, in turn, causes the VCO 140 to increase the frequency of $CLK_{out}$. Conversely, when $CLK_{ref}$ lags $CLK'_{out}$, the charge pump 120 decreases $I_{CP}$ to develop a smaller $V_c$ across the loop filter 130 which, in turn, causes the VCO 140 to decrease the frequency of $CLK_{out}$. When the feedback frequency $F'_{out}$ is ultimately locked onto the reference frequency $F_{ref}$, i.e. the phases of the two signals $CLK_{ref}$, $CLK'_{out}$ are aligned, the voltage $V_c$ is not adjusted and the output frequency $F_{out}$ is kept constant. In this state, the charge-pump PLL 100 is said to be in a "locked" condition.

The charge pump circuit 120 internally delivers a pump-up current and a pump-down current in response to the UP and DN signals. Therefore, the charge pump output current $I_{CP}$ is the sum of the pump-up and pump-down currents. Ideally, if the PLL 100 is "locked" and no change in the output frequency $F_{out}$ is needed, the pump-up current and the pump-down current would cancel each other and no net current $I_{CP}$ would be produced. Nevertheless, manufacturing process variations, ambient conditions and inherent device characteristics can cause the pump-up current and the pump-down current to mismatch. This current mismatch results in a residual charge being left on the loop filter 130 and further causes the voltage $V_c$ applied to the VCO 140 to fluctuate. As a result, the PLL output signal $CLK_{out}$ produces clock jitter. In addition to current mismatch, charge injection and loop filter leakage are sources of charge accumulation on the loop filter 130 which prevent the PLL 100 from being precisely locked.

In view of the above, there is a need for a charge-pump PLL that overcomes the problems of the prior art.

SUMMARY OF THE INVENTION

It is an object of the present invention to provide a charge-pump PLL with charge calibration to eliminate a residual charge so that the PLL keeps its output frequency constant.

According to one aspect of the invention, a charge-pump PLL circuit with charge calibration includes a first charge pump circuit and a calibration circuit. The first charge pump provides a first current to cause an output clock signal's phase to track a reference clock signal's phase. The calibration circuit is constructed of a second charge pump circuit and a charge sensing circuit. The second charge pump circuit provides a second current to simulate the first current in a condition in which the phase of the output clock signal is locked onto the phase of the reference clock signal. According to a first and second net charge generated by the first and the second currents separately, the charge sensing circuit generates a calibration voltage signal and provides it as feedback to the first charge pump and the second charge pump. Under control of the calibration voltage signal, the first and the second charge pumps circuit respectively regulate the first net charge and the second net charge to become exactly zero thereby maintaining the phase of the output clock signal locked onto the phase of the reference clock signal.

Preferably, the first charge pump circuit includes a first transistor having its gate coupled to receive the calibration voltage signal for fine tuning the first current based on the calibration voltage signal to eliminate the first net charge. The second charge pump circuit also includes a second transistor having its gate coupled to receive the calibration voltage signal for fine tuning the second current based on the calibrate voltage signal to eliminate the second net charge.

In one embodiment of the present invention, a charge-pump PLL with charge calibration is provided. The charge-pump PLL includes a first charge pump circuit and a calibration circuit. The first charge pump circuit provides a first current to cause an output clock signal's phase to track a reference clock signal's phase. The calibration circuit is constructed of a second phase detector, a second charge pump circuit, and an operational amplifier. The second phase detector receives the reference clock signal and generates a second pump-up pulse and a second pump-down pulse simultaneously at a rate of the reference clock signal. The second charge pump circuit is coupled to the second phase detector. In response to the second pump-up and the second pump-down pulses, the second charge pump circuit provides a second current so as to simulate the first current in a condition in which the phase of the output clock signal is locked onto the phase of the reference clock signal. The operational amplifier has a first input terminal coupled to an output terminal of the first charge pump and has a second input terminal coupled to an output terminal of the second charge pump circuit. In addition, the operational amplifier also has an output terminal connected to a control node of the first charge pump and a control node of the second charge pump respectively. The operational amplifier is used to provide a calibration voltage signal as feedback to the first charge pump circuit and the second charge pump circuit. Under control of the calibration voltage signal, the first and the second charge pumps respectively regulate a first net charge on the first input terminal of the operational amplifier and a second net charge on the second input terminal of the operational amplifier to become exactly zero, thereby maintaining the phase of the output clock signal locked onto the phase of the reference clock signal.

The first charge pump circuit preferably includes a first transistor arranged in cascade connection with the first charge pump circuit. The first transistor has its gate coupled to the control node of the first charge pump circuit to receive the calibration voltage signal. Based on the calibration voltage signal, the first transistor fine tunes the first current based on the calibration voltage signal to eliminate the first net charge. The second charge pump circuit also includes a second transistor arranged in cascade connection with the second charge pump circuit. The second transistor has its gate coupled to the control node of the second charge pump circuit to receive the calibration voltage signal. Likewise, the second transistor fine tunes the second current on the basis of the calibration voltage signal to eliminate the second net charge.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF THE INVENTION

Figure 1:
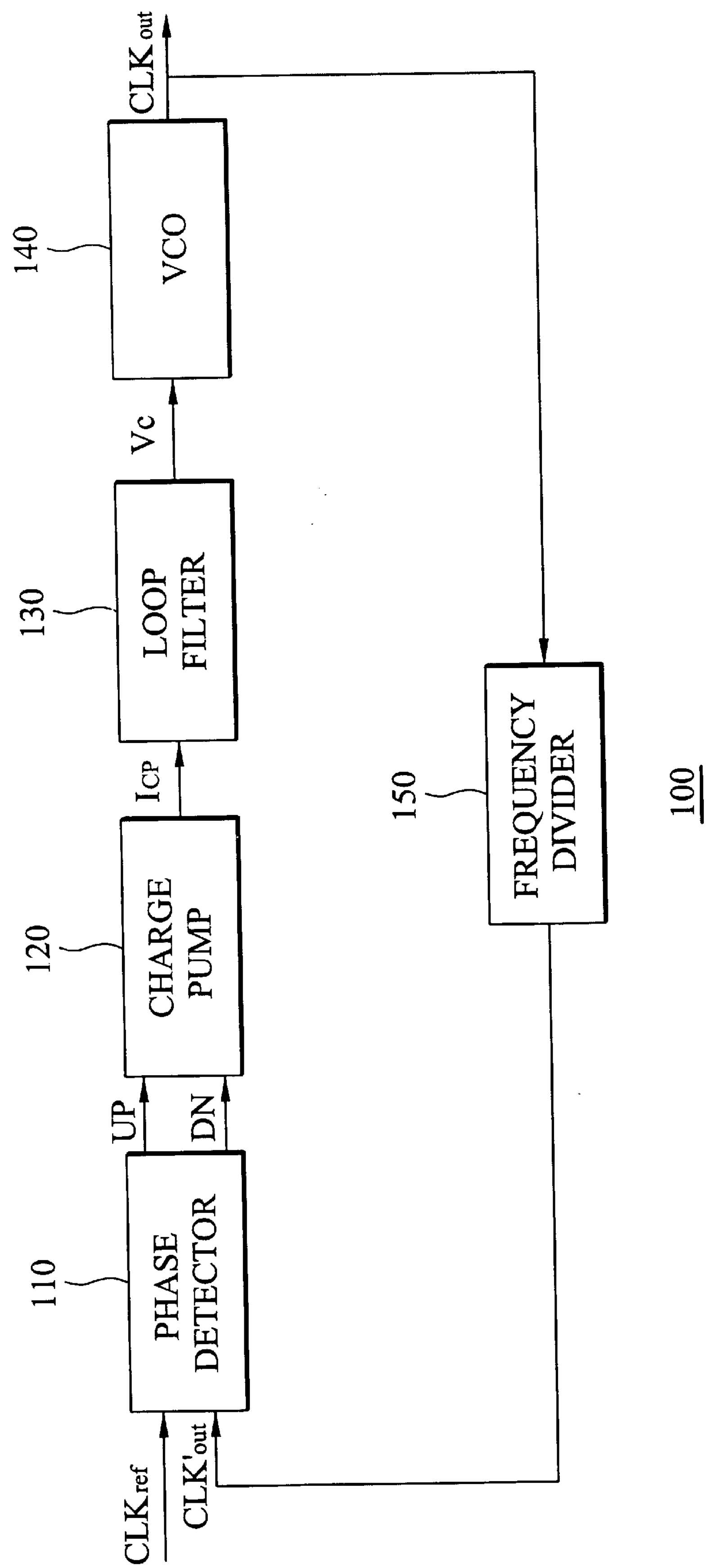
FIG. 1 is a block diagram of a charge-pump PLL in accordance with the prior art.
Figure 2:
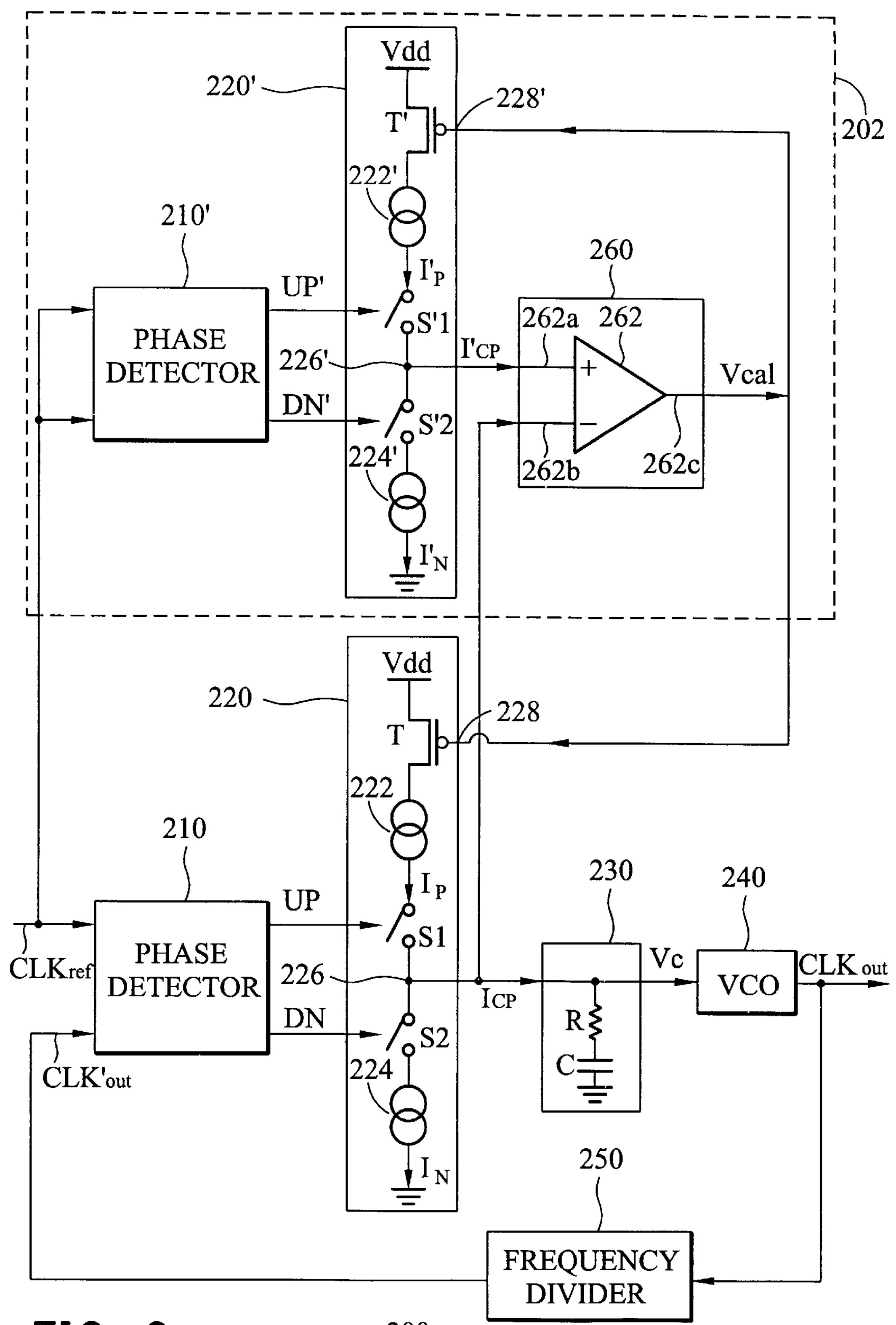
FIG. 2 is a block diagram of a charge-pump PLL with charge calibration in accordance with the present invention.

With reference to FIG. 2, the inventive charge-pump PLL 200 includes a phase detector 210, a charge pump circuit 220, a loop filter 230, a VCO 240, a frequency divider 250 and a calibration circuit 202. The charge-pump PLL 200 receives a reference clock signal $CLK_{ref}$ having a frequency $F_{ref}$ and generates an output clock signal $CLK_{out}$ having a frequency $F_{out}$ that is synchronized with the reference clock signal $CLK_{ref}$ in phase. The phase detector 210 is used to detect the phase difference between an output signal $CLK'_{out}$ of the frequency divider 250 and the reference clock signal $CLK_{ref}$ to generate a pump-up pulse UP and a pump-down pulse DN. In response to the UP pulse and the DN pulse, the charge pump 220 generates a current $I_{CP}$ to cause the output clock signal's phase to track the reference clock signal's phase. The loop filter 230 filters the current $I_{CP}$ to provide a filtered voltage to the VCO 240 as a frequency control voltage signal $V_c$. The VCO 240 generates an output clock signal $CLK_{out}$ with variable frequency in accordance with the signal $V_c$. Further, the frequency divider 250 divides the output clock frequency $F_{out}$ by a given divide ratio. The phase detector 210, the charge pump circuit 220, the loop filter 230, the VCO 240 and the frequency divider 250 form a charge-pump PLL, which are well known in the art and are not described in detail herein.

With continued reference to FIG. 2, the charge-pump PLL 200 also contains a calibration circuit 202 which is constructed of a phase detector 210', a charge pump 220' and a charge sensing circuit 260. The phase detector 210' has its two input terminals coupled together to receive the reference clock signal $CLK_{ref}$ so that it simultaneously generates a pump-up pulse UP' and a pump-down pulse DN' at a rate of the reference clock signal. In response to the UP' and the DN' pulses, the charge pump 220' provides a current $I'_{CP}$ to simulate the current $I_{CP}$ in a "locked" condition in which the phase of the output clock signal $CLK_{out}$ is locked onto the phase of the reference clock signal $CLK_{ref}$. To establish identical behavior and output characteristics, the charge pumps circuit 220 and 220' preferably have the same arrangement in accordance with the invention. Likewise, the phase detectors 210 and 210' are preferably arranged and manufactured in the same way. According to a net charge $\Delta Q$ delivered from the current $I_{CP}$ and a net charge $\Delta Q'$ delivered from the current $I'_{CP}$, the charge sensing circuit 260 generates a calibration voltage signal $V_{CAL}$ and provides it as feedback to the charge pump circuit 220 and the charge pump circuit 220'. Under control of the calibration voltage signal $V_{CAL}$, the charge pump circuits 220 and 220' respectively regulate the net charge $\Delta Q$ and the net charge $\Delta Q'$ to become exactly zero.

The features of the invention will be more clearly understood from the detailed description below. As illustrated in FIG. 2, the charge pump circuit 220' may include a "source" current mirror 222' and a "sink" current mirror 224'. Switches S1' and S2', which can be transistors, are coupled to the phase detector 210' to be controlled by the signals UP' and DN', respectively. The charge sensing circuit 260 contains an operational amplifier (OPA) 262 having one output terminal 262*c* and two input terminals 262*a*, 262*b*. According to the invention, a transistor T' is arranged in cascade connection with the charge pump circuit 220'. Each transistor described herein is either a P-type or N-type MOS transistor having a gate, a drain and a source. Since a MOS transistor is typically a symmetrical device, the true designation of "source" and "drain" is only possible once a voltage is impressed on the terminals. The designations of source and drain herein should be interpreted, therefore, in the broadest sense. In one embodiment, the transistor T' has its source connected to a voltage supply Vdd, its drain connected to the current mirror 222', and its gate connected to a control node 228' of the charge pump circuit 220'. The output terminal 262*c* of the OPA (operational amplifier) 262 is connected to the control node 228' of the charge pump 220' to provide the calibration voltage signal $V_{CAL}$. The input terminal 262*a* of the OPA 262 is connected to a common node 226' of the switches S1' and S2' which is an output terminal of the charge pump 220' providing the current $I'_{CP}$. In similar fashion, the charge pump 220 may include a "source" current mirror 222 and a "sink" current mirror 224. Switches S1 and S2 are coupled to the phase detector 210 to be turned on or off under control of the signals UP and DN, respectively. Moreover, a transistor T is arranged in cascade connection with the charge pump 220. In one embodiment, the transistor T has its source connected to the voltage supply Vdd, its drain connected to the current mirror 222, and its gate connected to a control node 228 of the charge pump circuit 220. The output terminal 262*c* of the OPA 262 is also connected to the control node 228 of the charge pump 220 to provide the calibration voltage signal $V_{CAL}$. The input terminal 262*b* of the OPA 262 is connected to a common node 226 of the switches S1 and S2 which is an output terminal of the charge pump circuit 220 providing the current $I_{CP}$.

In one embodiment, the phase detector 210 (210') generates the phase between the UP (UP') and DN (DN') signals to be substantially equal to the phase difference between its input terminals. When the UP pulse is applied to the switch S1, the switch S1 turns on which causes a pump-up current $I_p$ provided by the current mirror 222 to flow into the loop filter 230. Conversely, if the DN pulse is applied to the switch S2, the switch S2 turns on which causes a pump-down current $I_N$ provided by the current mirror 224 to flow out of the loop filter 230. The charge pump output current $I_{CP}$ is the sum of the pump-up and pump-down currents, i.e. $I_{CP}=I_P+(-I_N)$. To avoid "dead zone" problems, the UP and DN pulses generated by the phase detector 210 have a minimum width (duration) in order to ensure that the charge pump 220 has time to turn on. The "dead zone" is essentially a range of phase differences in response to which the phase detector cannot produce pulses of sufficient duration to activate the charge pump. Preferably, the phase detector 210' and charge pump 220' operate in a similar fashion, so $I'_{CP}=I'_P+(-I'_N)$.

In FIG. 2, the loop filter 230 is illustrated with a first-order filter including a resistor R and a capacitor C. It should be understood to those skilled in the art that other suitable high-order filters are contemplated to replace the first-order filter by the principles of the invention. In the actual operation of the circuit of the present invention, a UP pulse of width $T_P$ causes the pump-up current $I_P$ to deposit a charge equal to $(I_PT_P)$ on the capacitor C, and a DN pulse of width $T_N$ causes the pump-down current $I_N$ to remove a charge equal to $(I_NT_N)$ from the capacitor C. The pump-down current $I_P$ is ideally equal to the pump-down current $I_N$, and the Up pulse width $T_P$ is equal to the DN pulse width $T_N$ when the PLL is in the "locked" condition of the PLL. However, they are not perfect in practice. The net charge ΔQ delivered from the resultant current $I_{CP}$ is equal to $I_PT_P+(-I_NT_N)$, which remains on the loop filter 230 to form a residual charge.

The use of the charge pump 220' is to provide the net charge $\Delta Q'=I'_PT'_P+(-I'_NT'_N)$ to simulate the net charge ΔQ on the loop filter 230. According to the invention, the charge pumps 220 and 220' preferably have identical characteristics. The OPA 260 senses the net charge ΔQ' on the input terminal 262*a* and the net charge ΔQ on the other input terminal 262*b*. If the net charge ΔQ' is positive, the OPA 260 increases the calibration voltage signal $V_{CAL}$. The increased feedback voltage $V_{CAL}$ causes the transistors T', T to fine tune the ΔQ' and ΔQ', and decrease the respective pump-up currents $I'_P$ and $I_P$. Conversely, the OPA 260 decreases the calibration voltage signal $V_{CAL}$ if the net charge ΔQ' is negative. The decreased feedback voltage $V_{CAL}$ causes the transistors T', T to increase the respective pump-up currents $I'_P$ and $I_P$. Eventually, the net charges ΔQ and ΔQ' are thus eliminated. In addition, the two input terminals of OPA 260 may track each other in potential due to the OPA 260 being in the form of "negative feedback", that is, a "virtual short circuit" exists between the two input terminals 262*a*, 262*b*. A "virtual short circuit" means that whatever voltage at terminal 262*a* will automatically appear at terminal 262*b*. As a result, the net charge ΔQ becomes zero when the net charge ΔQ' is eliminated. Since there is no residual charge left on the loop filter 230, the output clock frequency $F_{out}$ is thus maintained and the output clock signal $CLK_{out}$ is synchronized with the reference clock signal $CLK_{ref}$ in phase without clock jitter. It should be understood to those skilled in the art that a transistor arranged in cascade connection with the current mirror 224 (224') is contemplated to regulate the pump-down current $I_N$ ($I'_N$) instead of the pump-up current by the principles of the invention.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A charge-pump phase-locked loop circuit, comprising:

a first charge pump circuit for providing a first current to cause an output clock signal's phase to track a reference clock signal's phase; and a calibration circuit comprising:

a second charge pump circuit for providing a second current to simulate the first current in a condition in which the phase of the output clock signal is locked onto the phase of the reference clock signal; and a charge sensing circuit for generating a calibrate voltage signal in accordance with a first net charge delivered from the first current and a second net charge delivered from the second current, and for providing the calibrate voltage signal as feedback to the first charge pump and the second charge pump;

wherein the first and the second charge pump circuits, under control of the calibration voltage signal, respectively regulate the first net charge and the second net charge to become exactly zero thereby maintaining the phase of the output clock signal locked onto the phase of the reference clock signal.

2. The charge-pump phase-locked loop as recited in claim 1 wherein the first charge pump comprises a first transistor for fine tuning the first current based on the calibrate voltage signal to eliminate the first net charge.

3. The charge-pump phase-locked loop as recited in claim 2 wherein the first transistor has its gate receiving the calibrate voltage signal.

4. The charge-pump phase-locked loop as recited in claim 1 wherein the second charge pump comprises a second transistor for fine tuning the second current based on the calibrate voltage signal to eliminate the second net charge.

5. The charge-pump phase-locked loop as recited in claim 4 wherein the second transistor has its gate receiving the calibrate voltage signal.

6. The charge-pump phase-locked loop as recited in claim 1 wherein the calibration circuit further comprises a second phase detector for receiving the reference clock signal to simultaneously generate a second pump-up pulse and a second pump-down pulse at a rate of the reference clock signal, and the second charge pump provides the second current in response to the second pump-up and the second pump-down pulses.

7. The charge-pump phase-locked loop as recited in claim 6 further comprising:

a divider for dividing the output clock signal's frequency by a given divide ratio;

a voltage-controlled oscillator for generating the output clock signal with variable frequency in accordance with a frequency control voltage signal;

a loop filter for filtering the first current to provide a filtered voltage to the voltage-controlled oscillator as the frequency control voltage signal; and a first phase detector for detecting phase difference between an output signal of the divider and the reference clock signal to generate a first pump-up pulse and a first pump-down pulse, wherein the first charge pump generates the first current in response to the first pump-up and the first pump-down pulses.

8. The charge-pump phase-locked loop as recited in claim 1 wherein the charge sensing circuit comprises an operational amplifier for sensing the first net charge and the second net charge to generate the calibrate voltage signal.

9. A charge-pump phase-locked loop, comprising:

a first charge pump circuit for providing a first current to cause an output clock signal's phase to track a reference clock signal's phase;

a first transistor arranged in cascade connection with the first charge pump circuit for fine tuning the first current based on a calibrate voltage signal to eliminate a first net charge delivered from the first current;

a calibration circuit comprising:

a second phase detector, receiving the reference clock signal, for simultaneously generating a second pump-up pulse and a second pump-down pulse at a rate of the reference clock signal;

a second charge pump, responsive to the second pump-up and the second pump-down pulses, for providing a second current to simulate the first current in a condition in which the phase of the output clock signal is locked onto the phase of the reference clock signal;

a second transistor arranged in cascade connection with the second charge pump for fine tuning the second current based on the calibrate voltage signal to eliminate a second net charge delivered from the second current; and a charge sensing circuit for generating the calibrate voltage signal in accordance with the first net charge and the second net charge, and for providing the calibrate voltage signal as feedback to the first and the second transistors;

wherein the first charge pump with the first transistor and the second charge pump with the second transistor, under control of the calibrate voltage signal, respectively regulate the first net charge and the second net charge to become exactly zero thereby maintaining the phase of the output clock signal locked onto the phase of the reference clock signal.

10. The charge-pump phase-locked loop as recited in claim 9 wherein the first transistor has its gate receiving the calibrate voltage signal.

11. The charge-pump phase-locked loop as recited in claim 9 wherein the second transistor has its gate receiving the calibrate voltage signal.

12. The charge-pump phase-locked loop as recited in claim 9 further comprising:

a divider for dividing the output clock signal's frequency by a given divide ratio;

a voltage-controlled oscillator for generating the output clock signal with variable frequency in accordance with a frequency control voltage signal;

a loop filter for filtering the first current to provide a filtered voltage to the voltage-controlled oscillator as the frequency control voltage signal; and a first phase detector for detecting phase difference between an output signal of the divider and the reference clock signal to generate a first pump-up pulse and a first pump-down pulse, wherein the first charge pump generates the first current in response to the first pump-up and the first pump-down pulses.

13. The charge-pump phase-locked loop as recited in claim 9 wherein the charge sensing circuit comprises an operational amplifier for sensing the first net charge and the second net charge to generate the calibrate voltage signal.

14. A charge-pump phase-locked loop with charge calibration, comprising:

a first charge pump for providing a first current to cause an output clock signal's phase to track a reference clock signal's phase; and a calibration circuit comprising:

a second phase detector, receiving the reference clock signal, for simultaneously generating a second pump-up pulse and a second pump-down pulse at a rate of the reference clock signal;

a second charge pump coupled to the second phase detector, for providing a second current in response to the second pump-up and the second pump-down pulses, wherein the second current is used to simulate the first current in a condition in which the phase of the output clock signal is locked onto the phase of the reference clock signal; and an operational amplifier having a first input terminal coupled to an output terminal of the first charge pump, a second input terminal coupled to an output terminal of the second charge pump, and an output terminal connected to a control node of the first charge pump and a control node of the second charge pump respectively, for providing a calibrate voltage signal as feedback to the first charge pump and the second charge pump;

wherein the first and the second charge pumps, under control of the calibrate voltage signal, respectively regulate a first net charge on the first input terminal of the operational amplifier and a second net charge on the second input terminal of the operational amplifier to become exactly zero thereby maintaining the phase of the output clock signal locked onto the phase of the reference clock signal.

15. The charge-pump phase-locked loop as recited in claim 14 wherein the first charge pump comprises a first transistor arranged in cascade connection with the first charge pump, for fine tuning the first current based on the calibrate voltage signal to eliminate the first net charge.

16. The charge-pump phase-locked loop as recited in claim 15 wherein the first transistor has its gate coupled to the control node of the first charge pump to receive the calibrate voltage signal.

17. The charge-pump phase-locked loop as recited in claim 14 wherein the second charge pump comprises a second transistor arranged in cascade connection with the second charge pump, for fine tuning the second current based on the calibrate voltage signal to eliminate the second net charge.

18. The charge-pump phase-locked loop as recited in claim 17 wherein the second transistor has its gate coupled to the control node of the second charge pump to receive the calibrate voltage signal.

19. The charge-pump phase-locked loop as recited in claim 14 further comprising:

a divider for dividing the output clock signal's frequency by a given divide ratio;

a voltage-controlled oscillator for generating the output clock signal with variable frequency in accordance with a frequency control voltage signal;

a loop filter coupled to the output terminal of the first charge pump, for filtering the first current to provide a filtered voltage to the voltage-controlled oscillator as the frequency control voltage signal; and a first phase detector for detecting phase difference between an output signal of the divider and the reference clock signal to generate a first pump-up pulse and a first pump-down pulse, wherein the first charge pump generates the first current in response to the first pump-up and the first pump-down pulses.

20. The charge-pump phase-locked loop as recited in claim 14 wherein the operational amplifier, having the first and the second input terminals and the output terminal, senses the first net charge on its first input terminal and the second net charge on its second input terminal to generate the calibrate voltage signal on its output terminal.

* * * * *